US008029167B2

(12) United States Patent
Ikeda et al.

(10) Patent No.: US 8,029,167 B2
(45) Date of Patent: Oct. 4, 2011

(54) LIGHT EMITTING DEVICE

(75) Inventors: Tomihiko Ikeda, Himeji (JP); Andrei Kazmierski, Himeji (JP); Kana Watanabe, Himeji (JP)

(73) Assignee: Phoenix Electric Co., Ltd., Himeji-Shi (Hyogo) (JP)

( * ) Notice: Subject to any disclaimer, the term of this patent is extended or adjusted under 35 U.S.C. 154(b) by 0 days.

(21) Appl. No.: 12/828,877

(22) Filed: Jul. 1, 2010

(65) Prior Publication Data

US 2011/0044025 A1 Feb. 24, 2011

(30) Foreign Application Priority Data

Aug. 24, 2009 (JP) ................................. 2009-193538

(51) Int. Cl.
*F21V 5/00* (2006.01)
(52) U.S. Cl. .................. 362/327; 362/249.02; 362/257; 362/329; 359/641
(58) Field of Classification Search .................... 362/84, 362/249.02, 257, 326, 296.01, 296.07, 296.08, 362/310, 327–329, 255, 334–336, 340, 346, 362/347, 350, 551, 555, 574, 800; 359/708, 359/711, 712, 726, 727, 869; 257/E33.067, 257/E33.071, E33.073
See application file for complete search history.

(56) References Cited

U.S. PATENT DOCUMENTS

| | | | | |
|---|---|---|---|---|
| 5,757,557 A * | 5/1998 | Medvedev et al. | ............ | 359/708 |
| 6,547,423 B2 * | 4/2003 | Marshall et al. | ............. | 362/333 |
| 6,819,506 B1 * | 11/2004 | Taylor et al. | ................... | 359/726 |
| 6,850,095 B2 * | 2/2005 | Sayers et al. | .................. | 362/551 |
| 7,172,319 B2 * | 2/2007 | Holder et al. | ................. | 362/341 |
| 7,401,948 B2 * | 7/2008 | Chinniah et al. | ............... | 362/326 |
| 7,438,447 B2 * | 10/2008 | Holder et al. | ................. | 362/346 |
| 7,473,013 B2 * | 1/2009 | Shimada | ........................ | 362/327 |
| 7,557,781 B2 * | 7/2009 | Chuang et al. | .................. | 345/82 |
| 7,581,855 B2 * | 9/2009 | Holder et al. | ................. | 362/346 |
| 7,591,570 B2 * | 9/2009 | Holder et al. | ................. | 362/341 |
| 2004/0264188 A1 * | 12/2004 | Tazawa et al. | ................ | 362/257 |
| 2009/0128921 A1 * | 5/2009 | Roth | ............................. | 359/641 |
| 2009/0262517 A1 * | 10/2009 | Suehiro et al. | .................. | 362/84 |

FOREIGN PATENT DOCUMENTS

| | | |
|---|---|---|
| JP | 2004-326000 | 11/2004 |
| JP | 2006-128041 | 5/2006 |
| JP | 2006-201428 | 8/2006 |
| JP | 2009-010049 | 1/2009 |
| JP | 2009-158177 | 7/2009 |

* cited by examiner

*Primary Examiner* — Hargobind Sawhney
(74) *Attorney, Agent, or Firm* — Lucas & Mercanti, LLP (57) ABSTRACT

The light emitting device comprises a point light source, a solid and transparent light guide, a recess arranged on center of a light receiving surface of the light guide, a concave lens formed on a surface of the recess. A reflecting side surface is a revolving surface determined by revolving a parabola passing through one point of peripheral border of the light receiving surface and the other point of peripheral border of the light radiating surface, and having a focal point on the other point of peripheral border. The point light source is arranged apart from the light receiving surface so as to divide the light from the point light source into light entering into the light guide through the surface of the recess and light entering into the light guide through some part of the light receiving surface other than the recess.

4 Claims, 7 Drawing Sheets

LIGHT EMITTING DEVICE

BACKGROUND OF THE INVENTION

1. Field of the Invention

The present invention relates to a light emitting device that regulates a light distribution angle and illuminates a lighting field with high uniformity.

2. Description of the Related Art

To concentrate light, which is radiated from a light source, for illuminating a lighting field efficiently is important for designing a light emitting device. Various light emitting devices have been developed to work out such issue. (For example, see Patent Document 1: Japanese Patent Application Laid-open No. 2006-128041.)

Figure 8:
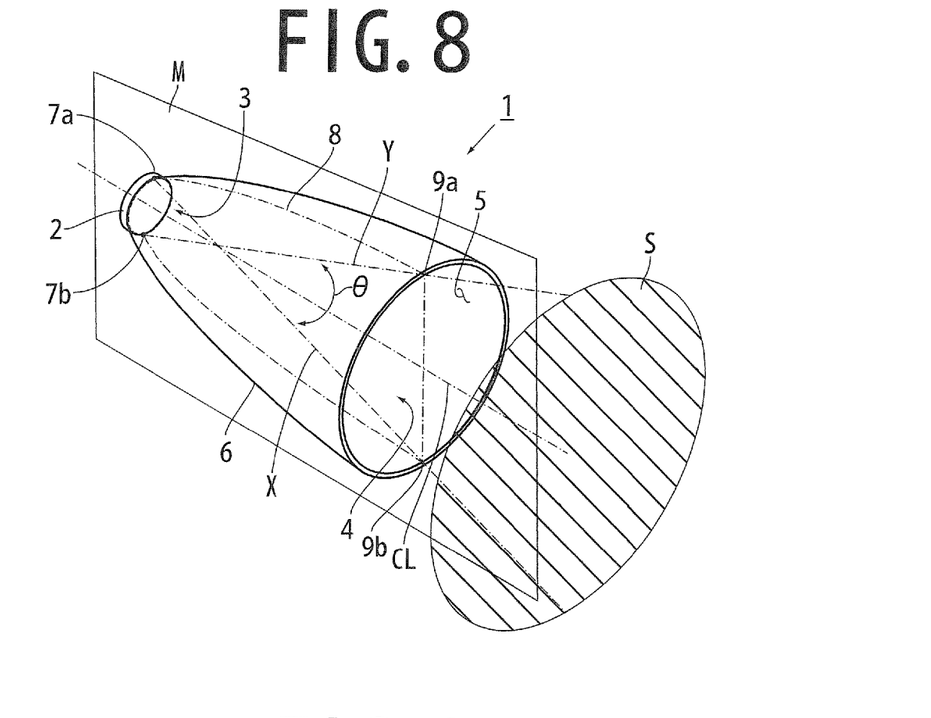
FIG. 8 is a diagram illustrating a conventional art.

As shown in FIG. 8, a light emitting device 1 described in the Patent Document 1 comprises mainly a surface light source 2; a bowl-shaped reflector 6 having an opening for incidence 3 through which the light from the surface light source 2 passes inside; an opening for radiation 4 facing to the opening for incidence 3; and a reflecting surface 5 reflecting the light from the opening for incidence 3 to the opening for radiation 4.

When a plane M containing a center axis CL is assumed, two points of peripheral border 7a, 7b of the opening for incidence 3 and two point of peripheral border 9a, 9b of the opening for radiation 4 are determined. And a coordinate system having a horizontal axis passing through the point of peripheral border 7b, and parallel to a straight line X passing through the points of peripheral border 7a and 9 is determined. The reflecting surface 5 of the reflector 6 is a paraboloid of revolution that is determined by revolving a parabola 8 around the center axis CL. The parabola 8 passes through the points of peripheral border 7a and 9a, and has a focal point on the other point of peripheral border 7b of the opening for incidence 3.

According to this light emitting device 1, the light from the surface light source 2 is radiated within an aperture angle θ that is determined with a straight line X passing through the points of peripheral border 7a, 9b and a straight line Y passing through the points of peripheral border 7b, 9a. For example, when the light emitted from the point of peripheral border 7b of the opening for incidence 3 directly passes through the opening for radiation 4 without reflecting on the reflecting surface 5, the light forms an angle with the center axis CL. The angle is the same angle between the straight line Y and the center axis CL (=θ/2). In contrast, the light reflected on the reflecting surface 5 is parallel to the straight line X, because the point of peripheral border 7b is on the focal point of the parabola 8. All light from outer edge of the opening for incidence 3 is in the same manner, because the outer edge of the opening for incidence 3 is determined with a circle that is around the center axis CL of the point of peripheral border 7b. The point of peripheral border 7b is on the focal point of the parabola 8 in the plane M. The light that is radiated from inner side of the opening for incidence 3 is radiated in an angle. The angle between the light and the center axis CL is smaller than ½θ.

Therefore, a lighting area S of the light from the surface light source 2 is regulated within predetermined angle θ by the reflector 6.

SUMMARY OF THE INVENTION

Figure 9:
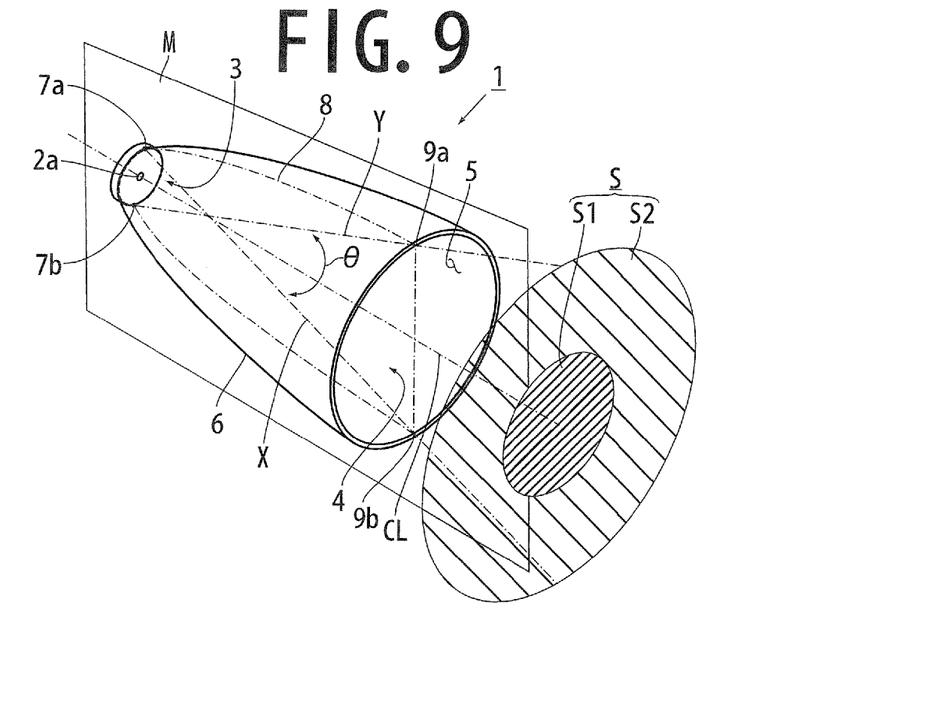
FIG. 9 is a diagram illustrating a conventional art.

As described above, the lighting area S is regulated within predetermined angle θ. But a point light source 2a, for example an LED (Light Emitting Diode), is used for the light emitting device 1, as shown in FIG. 9, with deterioration in light uniformity.

Figure 10:
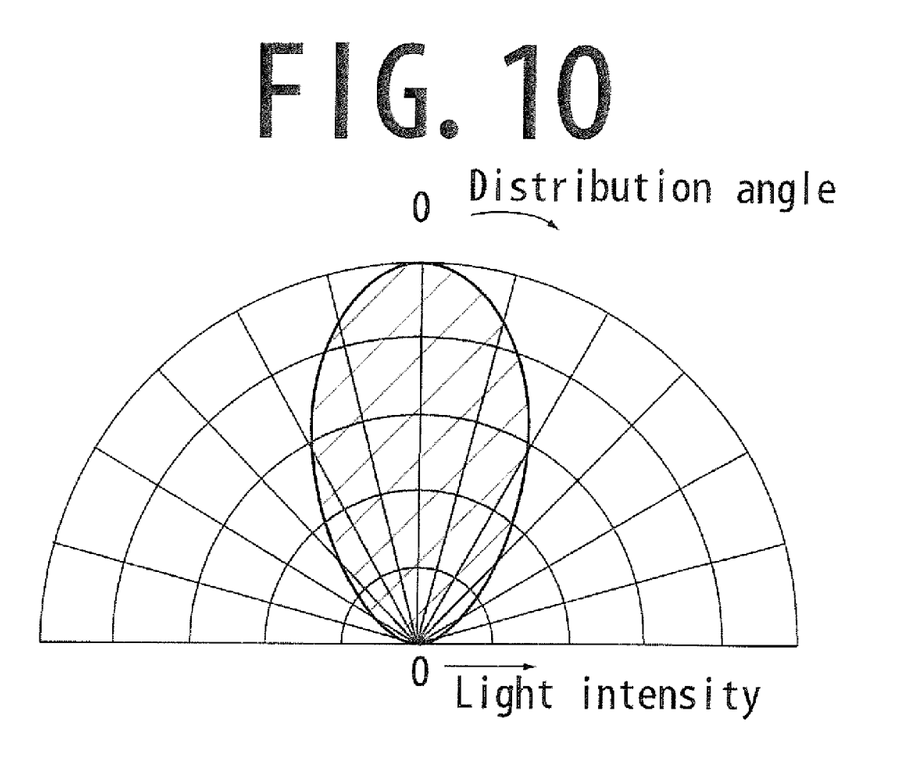
FIG. 10 is a polar coordinate system of the relation between light distribution angles and light intensity.

The distribution angle of the light from the LED 2a expressed in polar coordinate is shown in FIG. 10. According to the FIG. 10, the distribution angle of the light from the LED 2a is narrow, in other words, the light is "directional light." As shown in FIG. 9, most of the light from the LED 2a directly exits through the opening for radiation 4 without reflecting on the reflecting surface 5 of the reflector 6. As a result, a central part S1 of the lighting area S is illuminated brightly, and an outer edge part S2 of the lighting area S becomes relatively-dark.

A main subject of the present invention is to provide a light emitting device using a point light source having a narrow distribution angle; the light emitting device regulates its distribution angle and illuminates the lighting area with high-uniformity light.

According to a first aspect of the present invention, a light emitting device 10 comprises:

a point light source 12 having a narrow distribution angle;

a solid and transparent light guide 14 having a light receiving surface 20 receiving the light from the point light source 12, a reflecting side surface 22 reflecting internally the light from the light receiving surface 20, and a light radiating surface 24 radiating the light reflected on the reflecting side surface 22;

a recess 26 arranged on center of the light receiving surface 20 and facing to the point light source 12; and a concave lens 28 formed on a surface of the recess 26, wherein the reflecting side surface 22 is a revolving surface determined by revolving a parabola P around a center axis CL fitting to a light axis L of the point light source 12, the parabola P is a segment AD of a parabola passing through one point of peripheral border A of the light receiving surface 20, and the other point of peripheral border D of the light radiating surface 24; and having a focal point on the other point of peripheral border B of the light receiving surface 20, obtained by assuming a plane M containing the center axis CL and cutting off the light guide 14; two points of peripheral border A and B of the light receiving surface 20; two point of peripheral border C and D of the light radiating surface 24; and a coordinate system parallel to a straight line X passing through one point of peripheral border A of the light receiving surface 20 and one point of peripheral border C of the light radiating surface 24, and having a horizontal axis passing through the other point of peripheral border B of the light receiving surface 20, the point light source 12 is arranged apart from the light receiving surface 20 so as to divide the light from the point light source 12 into light R1 entering into the light guide 14 through the surface of the recess 26 and light R2 entering into the light guide 14 through some part of the light receiving surface 20 other than the recess 26.

According to the light emitting device 10, the reflecting side surface 22 of the solid and transparent light guide 14 is a revolving surface determined by revolving the parabola P, the same as the reflecting surface 5 in the Patent Document 1, around the center axis CL. Accordingly, the light from the point light source 12 is concentrated within an angle by the light guide 14.

This light emitting device 10 is characterized by the recess 26 arranged on the center part of the light receiving surface 20 of the light guide 14. The recess 26 has the concave lens 28 and faces to the point light source 12. And the light guide 14 has the center axis CL fitting to the light axis L of the point light source 12.

Figure 4:
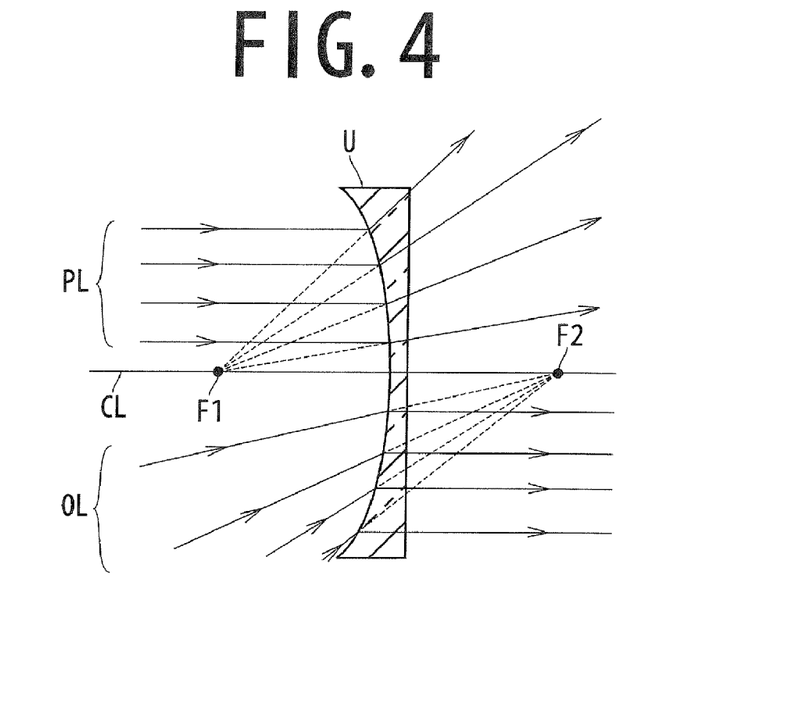
FIG. 4 is a diagram illustrating characteristics of a concave lens.

FIG. 4 illustrates characteristics of a concave lens U. After being refracted with the concave lens U, light PL parallel to the center axis CL of the concave lens U, shown at upper side of the center axis CL, travels on a line that passes through the front focal point F1, which is located in incident (front) side of the concave lens U and located on the center axis CL, and an intersection of the concave lens U with the light PL as if the light from the focal point F (diffusion). And after being refracted with the concave lens U, light OL, shown at lower side of the center axis CL, traveling to the rear focal point F2, which is located in radiation side of the concave lens U and located on the center axis CL, becomes the light parallel to the center axis CL.

Consequently, by passing through the surface (the concave lens 28) of the recess 26, the light having strong directional characteristics from the point light source 12 is diffused from the center axis CL.

Figure 5:
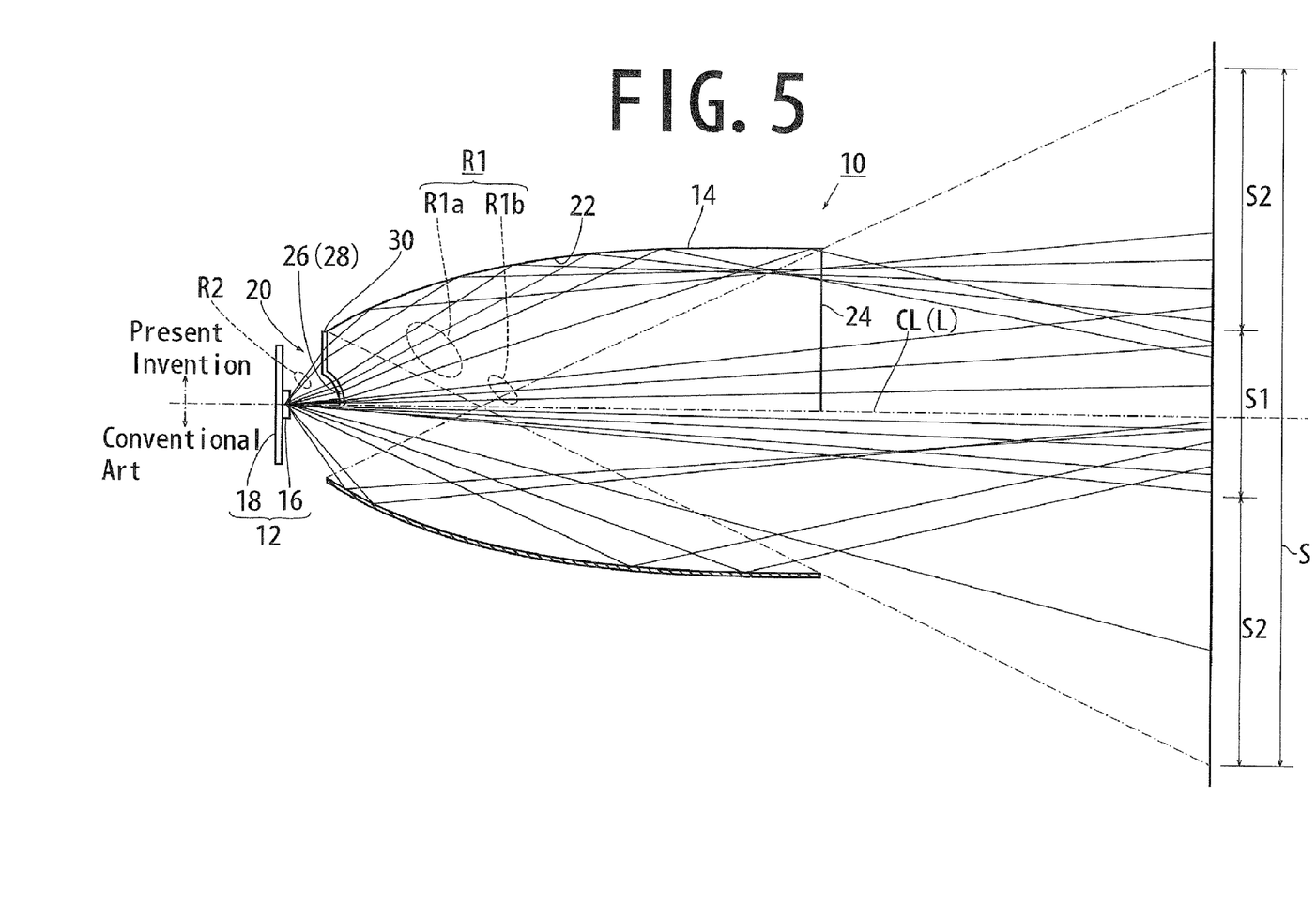
FIG. 5 is a diagram showing locus of light in a light guide (no hatching)

As shown in FIG. 5, when the light from the point light source 12 is diffused by the concave lens 28, the light R1a having a relatively large angle with the center axis CL is diffused, with an increase in the angle. As a result, the light R1a, which is reflected on the reflecting side surface 22 of the light guide 14, illuminates a peripheral border part S2 of the lighting area S.

On the other hand, the light R1b having a relatively small angle with the center axis CL is also diffused, with an increase in the angle. As a result, the light R1b, which is not reflected on the reflecting side surface 22 of the light guide 14, passes through the light radiating surface 24 and is radiated directly. The light R1b illuminates wider lighting area S with the concave lens 28.

The embodiment described above is for the point light source 12 having small amount of light and small size is arranged inside of the recess 26. And all of the light from the point light source 12 enters into the light guide 14 through the surface (the concave lens 28) of the recess 26. But a part of light R2 from the point light source 12 enters into the light guide 14 through some part of the light receiving surface 20 other than the recess 26, when the point light source 12 having large amount of light and large size is arranged apart from the light receiving surface 20 of the light guide 14.

Entering into the light guide 14, the light R2 is refracted, with a decrease in the angle between the light R2 and the center axis CL. In other words, the light R2 concentrates. The light R2 in the light guide 14 is radiated to the lighting area S through the light radiating surface 24, after reflecting internally on the reflecting side surface 22.

As just described, arrangement of the recess 26 having the concave lens 28 on center of the light receiving surface 20 of the light guide 14 causes a decrease in the amount of the light illuminating the center part S1 of the lighting area S, and an increase in the amount of light illuminating the outer edge part 52.

"A point light source" is not limited to really a "point" light source. Any light source having small light emitting surface, for example an LED, may be used.

Many fine projections and depressions may be formed on the surface of the recess 26 of the light receiving surface 20.

When the fine projections and depressions are formed, the light from the point light source 12 is not only diffused on the lens 28 but reflected irregularly by the fine projections and depressions. Consequently, more uniform light is radiated from the surface of the recess 26 into the light guide 14 as if the surface of the recess 26 emits light with wide distribution angle. As a result, the light uniformity of the lighting area S is improved. The fine projections and depressions may be formed not only on the surface of the recess 26 but on entire surface of the light receiving surface 20.

The point light source 12 may emit blue light, and a phosphor film 30 including Yttrium Aluminum Garnet (YAG) phosphor 29 that emits yellow or yellow-orange light by receiving the blue light may be formed on the surface of the recess 26.

When the blue light from the point light source 12 passes through the phosphor film 30, a part of the blue light strikes and excites the YAG phosphor 29 included in the phosphor film 30. As a result, the yellow or yellow-orange light that is complementary color of blue is radiated. Mixing the yellow or yellow-orange light and the remaining blue light that does not strike the YAG phosphor 29 causes the radiation of white light from the light emitting device 10.

The light emitting device 10 may have a reflector 50 having a concave reflecting surface 52. The light guide 14 may be inserted through an opening 50a of the reflector 50, and the light receiving surface 20 faces to bottom of the reflector 50. The point light source 12 may be arranged on the bottom of the reflector 50.

As described above, the light emitting device 10 of the present invention decreases the amount of the light illuminating the center part S1 of the lighting area S on the lighting field; and increases the amount of the light illuminating the outer edge part S2 of the lighting area S. Accordingly, the light emitting device 10 of the present invention regulates its distribution angle and illuminates the lighting area S with high-uniformity light by using a point light source having a narrow distribution angle.

DETAILED DESCRIPTION OF THE INVENTION

Figure 1:
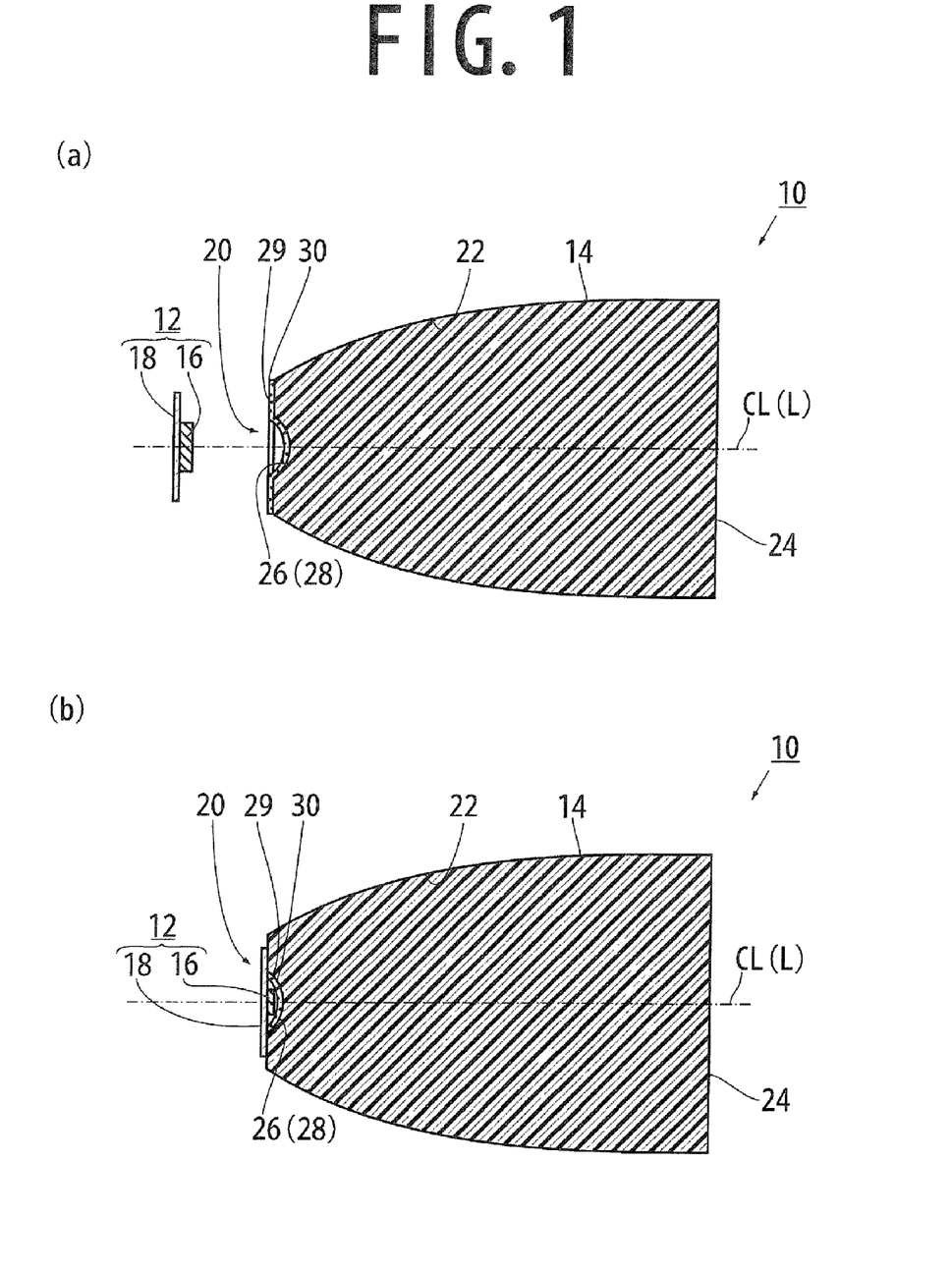
FIG. 1 is a sectional view of a light emitting device according to the present invention.
Figure 2:
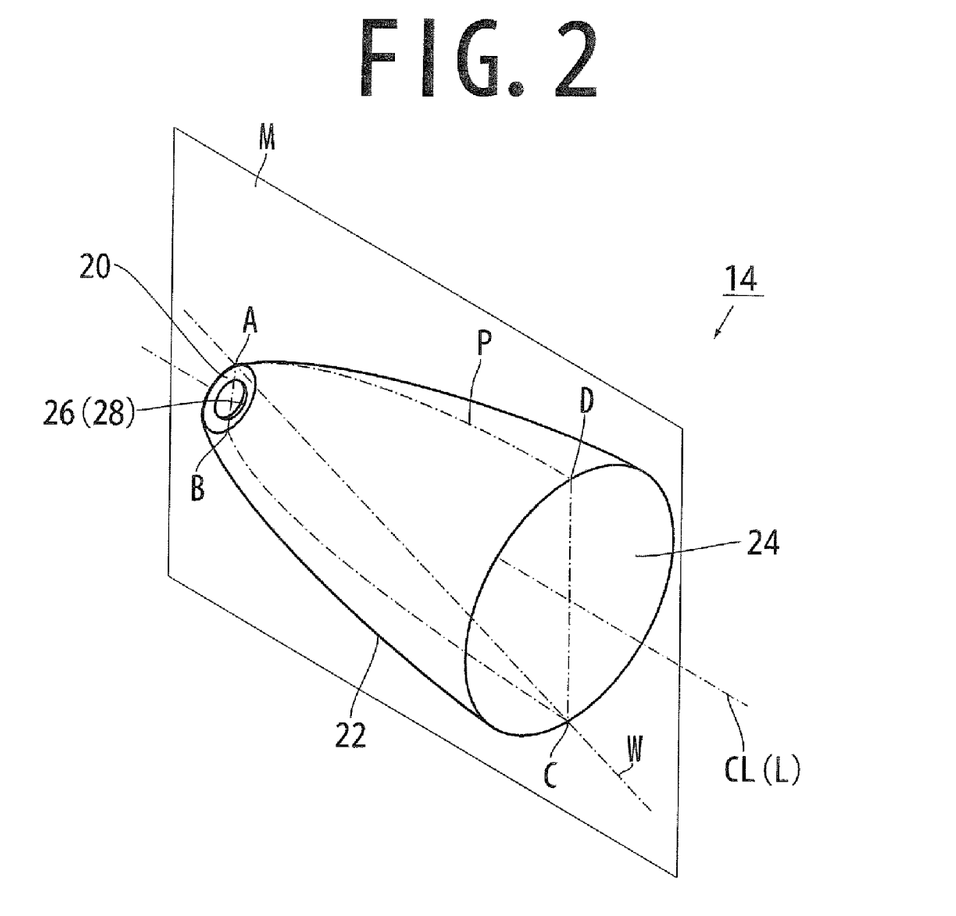
FIG. 2 is a perspective view of a light guide according to the present invention.

Preferred Embodiments of the present invention are explained with figures as below. FIG. 1 is a sectional view showing a light emitting device 10 of the present invention. FIG. 2 is a perspective view of a light guide 14 of the light emitting device 10. The light emitting device 10 comprises mainly a point light source 12 and the light guide 14.

The point light source 12 is an LED (Light Emitting Diode) having a narrow distribution angle. In this embodiment, the point light source 12 comprises a light-emitting part 16 radiating blue light, and a light-emitting part holder 18 supporting the light-emitting part 16; and having a power supply circuit supplying to the light-emitting part 16. The point light source 12 is not limited to the LED but any other type of light source having a narrow distribution angle may be used. The color of the light is also not limited to "blue." But, to generate white light with the YAG phosphor 29, the blue light is required.

The large and high-intensity point light source 12 may be arranged apart from a light receiving surface 20, as shown in FIG. 1 (a), as described below. The small and low-intensity point light source 12 may be arranged inside of the recess 26 of the light receiving surface 20, as shown in FIG. 1 (b). The following explanation is based on the FIG. 1 (a). The FIG. 1 (b) will be used as need arises.

The solid and transparent light guide 14 is made of polycarbonate. The light guide 14 may be made of other resin or quartz glass. The light guide 14 comprises a circular light receiving surface 20 receiving the light from the point light source 12, a reflecting side surface 22 reflecting internally the light from the light receiving surface 20, and a light radiating surface 24 radiating the light reflected on the reflecting side surface 22. A center axis CL of the light guide 14 fits to a light axis L of the point light source 12.

Figure 3:
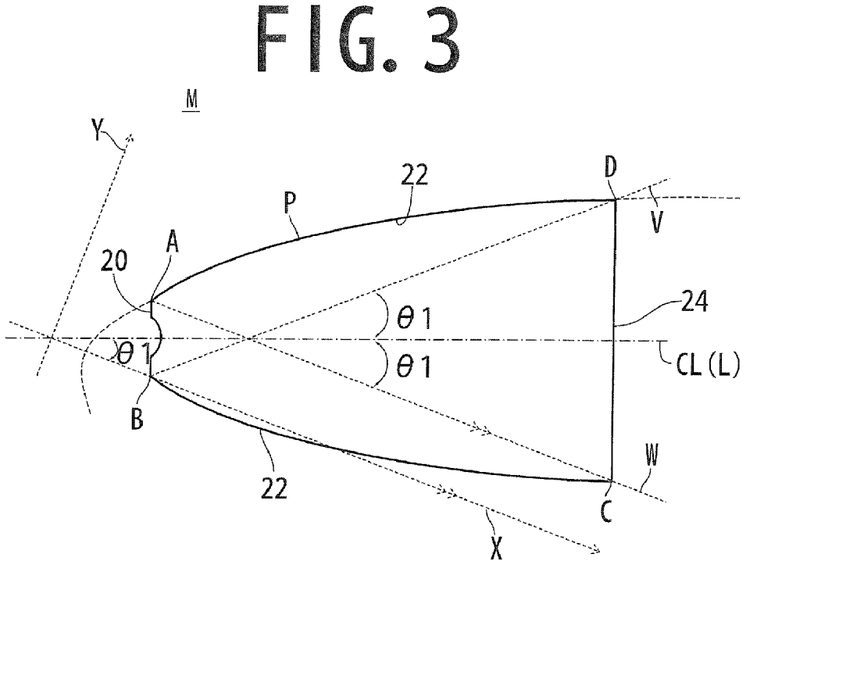
FIG. 3 is a sectional view of a light guide taken on a plane including a center axis.

The reflecting side surface 22 is a revolving surface determined by revolving around the center axis CL. When a plane M containing the center axis CL (the light axis L of the point light source 12) and cutting off the light guide 14 is assumed, a parabola P is determined as the cut edge of the reflecting side surface 22. The reflecting side surface 22 is determined by revolving the parabola P around the center axis CL.

FIG. 3 illustrates the parabola P. Two points of peripheral border of the light receiving surface 20 on the plane M are determined as "one point of peripheral border A" and "the other point of peripheral border B." Two points of peripheral border of the light radiating surface 24 on the plane M are determined as "one point of peripheral border C" and "the other point of peripheral border D." A point arranged opposite "one point of peripheral border A" behind the center axis CL is "one point of peripheral border C." And the other is "the other point of peripheral border D."

When a straight line W passing through one point of peripheral border A of the light receiving surface 20 and one point of peripheral border C of the light radiating surface 24 is drawn, a horizontal axis X parallel to the straight line W and passing through the other point of peripheral border D is assumed. An angle θ1 between the straight line W and the center axis CL is called "½ aperture angle" of the light guide 14. When a straight line V passing through the other point of peripheral border B of the light receiving surface 20 and the other point of peripheral border D of the light radiating surface 24 is drawn, another angle between the straight line V and the center axis CL is the same as the angle θ1.

When the horizontal axis X and a corresponding vertical axis Y is assumed, the parabola P is determined as a part (a segment AD) of a parabola passing through one point of peripheral border A of the light receiving surface 20 and the other point of peripheral border D of the light radiating surface 24. When the horizontal axis X, the vertical axis Y, one focal point (in this embodiment, the other point of peripheral border B), and one passing point (one point of peripheral border A) are determined, the parabola P can be determined uniquely.

A recess 26 is arranged on center of the light receiving surface 20. (See FIG. 1 and FIG. 2.) The recess 26 faces to the point light source 12. A surface of the recess 26 is a concave lens 28.

FIG. 4 illustrates characteristics of a concave lens U. After being refracted with the concave lens U, light PL parallel to the center axis CL of the concave lens U, shown at upper side of the center axis CL, travels on a line that passes through the focal point F1 in incident (front) side on the center axis CL and an intersection of the concave lens U with the light PL as if the light from the focal point F (diffusion). And after being refracted with the concave lens U, light OL, shown at lower side of the center axis CL, traveling to the rear focal point F2 in radiation side on the center axis CL becomes the light parallel to the center axis CL. Consequently, by passing through the surface (the concave lens 28) of the recess 26, the light from the point light source 12 is diffused from the center axis CL. As a result, an erected virtual image is formed by the concave lens U.

As described above, the concave lens 28 diffuses the incident light. As shown in FIG. 5, the light from the point light source 12 that passes through the concave lens 28 of the light receiving surface 20 is diffused from the center axis CL (the light axis L).

In this embodiment, a phosphor film 30 including YAG phosphor 29 that emits yellow or yellow-orange light by receiving the blue light is arranged on whole of the light receiving surface 20 including the recess 26. As shown in FIG. 1 (b), when the point light source 12 is arranged inside of the recess 26, the phosphor film 30 is required only on the surface of the recess 26. In case that it is not necessary to change the color of the light, the phosphor film 30 is not required. In other words, the phosphor film 30 is not an essential factor for the present invention.

Outside of the reflecting side surface 22 of the light guide 14 may be covered with a total reflection film. The total reflection film prevents the light from the light receiving surface 20 from passing through the reflecting side surface 22 to outside of the light guide 14 without reflecting on the reflecting side surface 22.

The light-emitting part 16, which receives electric power through a power circuit (not shown) on the light-emitting part holder 18, radiates the blue light to the light receiving surface 20 of the light guide 14 (see FIG. 5). And the blue light enters into the light guide 14 after passing through the phosphor film 30 on the light receiving surface 20.

When the blue light from the point light source 12 passes through the phosphor film 30, a part of the blue light strikes and excites the YAG phosphor 29 included in the phosphor film 30. As a result, the yellow or yellow-orange light that is complementary color of blue is radiated. Mixing the yellow or yellow-orange light and the remaining blue light that does not strike the YAG phosphor 29 causes the radiation of "white" light.

When the point light source 12 is arranged inside of the recess 26 of the light guide 14 (see FIG. 1 (b)), all light from the point light source 12 enters into the light guide 14 through the surface (the concave lens 28) of the recess 26. The light that passes through the surface of the recess 26 is called "light R1." In contrast, when the point light source 12 is arranged apart from the light receiving surface 20 of the light guide 14 (see FIG. 1 (a)), the light from the point light source 12 is divided into the light R1 and "light R2" that enters into the light guide 14 through some part of the light receiving surface 20 other than the recess 26. Hereinafter, the light R1 and the light R2 are explained in order.

(The Light R1 Passing Through the Surface of the Recess 26)

In conventional light emitting device, the light radiated from the light radiating surface without reflecting on the reflecting surface is divided into "the light R1a" that forms relatively large angle with the center axis CL and "the light R1b" that forms relatively small angle with the center axis CL.

The surface of the recess 26 is the concave lens 28, and the concave lens 28 diffuses the incident light. The light R1 entering into the light guide 14 through the recess 26 is diffused from the center axis CL, when the light R1 passes through the recess 26 (the concave lens 28). In other words, the angle between the light R1 and the center axis CL increases due to the diffusion. As a result, the angle between the light R1a and the center axis CL increases. The diffused light R1a from the light radiating surface 24 illuminates the outer edge of the lighting area S, after reflecting on the reflecting side surface 22 of the light guide 14.

On the other hand, the diffusion of the light R1b on the concave lens 28 causes the increase in the angle between the light R1b and the center axis CL. While the diffused light Rib remains as the light that is radiated without reflecting on the reflecting side surface 22, the diffused light Rib illuminates wider lighting area S than the light R1b in conventional light emitting device. Consequently, the amount of the light illuminating the center part S1 of the lighting area S decreases, and the amount of the light illuminating the outer edge of the lighting area increases.

(The Light R2 Entering into the Light Guide 14 Through Some Part of the Light Receiving Surface 20 Other than the Recess 26)

The light R2 entering into the light guide 14 is refracted and concentrated. Consequently, the angle between the light R2 and the center axis CL decreases. The light R2 in the light guide 14 is radiated from the light radiating surface 24 to the lighting area S, after reflecting on the reflecting side surface 22.

The light R1 that forms small angle with the center axis CL is refracted and diffused with the recess 26 (the concave lens 28) arranged on the light receiving surface 20. In contrast, the light R2 that forms large angle with the center axis CL is refracted and concentrated with some part of the light receiving surface 20 other than the recess 26.

The light emitting device 10 of the present invention decreases the amount of the light illuminating the center part S1 of the lighting area S on the lighting field; and increases the amount of the light illuminating the outer edge part S2 of the lighting area S. Accordingly, the light emitting device 10 of the present invention illuminates the lighting area S with high-uniformity light by using the point light source 12 having a narrow distribution angle to the light axis L (the center axis CL).

Additionally, the light receiving surface 20 including the recess 26 is formed smoothly in the embodiment. But many fine projections and depressions may be formed on the surface of the receiving surface 20 (including the surface of the recess 26). For example, such fine projections and depressions, like frosted glass, can be formed on the surface by sandblasting. In this case, the light from the point light source 12 is not only diffused on the lens 28 but reflected irregularly by the fine projections and depressions. Consequently, more uniform light is radiated from the surface of the recess 26 into the light guide as if the surface of the recess 26 emits light with wide distribution angle θ. That results in an improvement of the light uniformity for the lighting area S.

In this embodiment, the light emitting device 10 comprises one point light source 12 and one light guide 14. But the light emitting device 10 may comprise multiple point light sources 12 and a corresponding number of light guides 14. The compact light emitting device 10 with multiple point light source 12 can radiate a large amount of light from the multiple point light sources 12.

Figure 6:
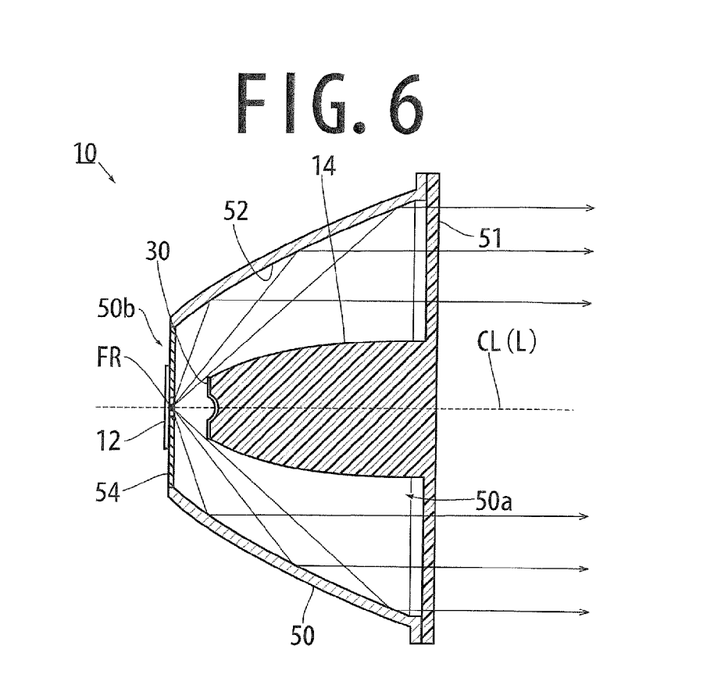
FIG. 6 is a sectional view of a light emitting device with a reflector.

The light emitting device 10 may further comprise a reflector 50, as shown in FIG. 6.

The bowl-shaped reflector 50 has a concave reflecting surface 52 inside. The concave reflecting surface 52 reflects light swerved from the light receiving surface 20 of the light guide 14 (the light which forms large angle with the center axis CL.) The reflector 50 is made of glass, aluminum, or resin, for example. The concave reflecting surface 52 of the aluminum reflector 50 is formed by metal evaporation or alumite treatment. The concave reflecting surface 52 of the glass reflector 50 is formed with a visible light reflecting film made of metal (aluminum, for example) film or multilayer film. The light emitting device 10 may further comprise a transparent cover 51 covering an opening 50a of the reflector 50, and a point light source holder 54 holding the point light source 12 at the position to conform the light axis L to the center axis CL of the light guide 14. The point light source holder 54 covers a bottom opening 50b of the reflector 50.

The transparent cover 51 is a plate made of polycarbonate, other resin, or glass, for example. In this embodiment, the transparent cover 51 is formed at the light radiating surface 24 side of the light guide 14, and formed integrally with the light guide 14.

Figure 7:
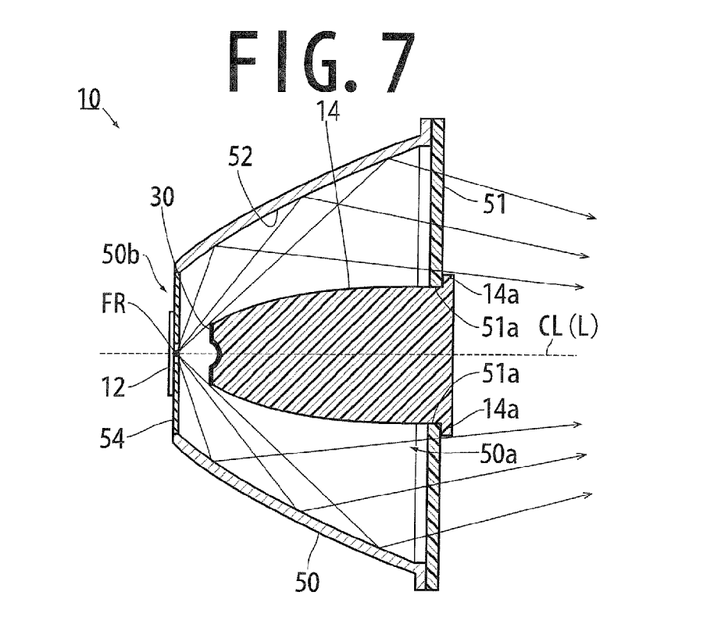
FIG. 7 is a sectional view of another light emitting device with a reflector.

The transparent cover 51, of course, may be formed separately from the light guide 14. For example, as shown in FIG. 7, the light guide 14 having a flange 14a integrally on outer surface at the light radiating surface 24 side edge may be used. The transparent cover 51 may have a light guide insert hole 51a in the center. The inner diameter of the light guide insert hole 51a is larger than the diameter of the light guide 14 and smaller than the diameter of the flange 14a. The light guide 14 with flange 14a is fixed to the transparent cover 51 with adhesive material, after being inserted into the light guide insert hole 51a.

The concave reflecting surface 52 is a paraboloid of revolution that is determined by revolving around the center axis CL. In this embodiment, the focal point FR of the paraboloid of revolution is arranged at the light-emitting part 16 of the point light source 12. But it is not an essential. An ellipsoid of revolution may be used for the concave reflecting surface 52. It is preferable to fit the focal point FR of the paraboloid of revolution on the light-emitting part 16, because the light reflected on the concave reflecting surface 52 can gain regularity. When the concave reflecting surface 52 is a paraboloid of revolution, as shown in FIG. 6, the light reflected on the concave reflecting surface 52 is parallel to the center axis CL. And when the concave reflecting surface 52 is an ellipsoid of revolution, as shown in FIG. 7, the light reflected on the concave reflecting surface 52 is concentrated to the light concentration point (rear focal point). Consequently, some required illuminate distribution can be formed.

Although the invention has been described in its preferred form with a certain degree of particularity, it is understood that the present disclosure of the preferred form has been changed in the details of construction and the combination and arrangement of parts may be resorted to without departing from the spirit and scope of the invention as hereinafter claimed.

The disclosure of Japanese Patent Application No. 2009-193538 filed Aug. 24, 2009 including specification, drawings and claims is incorporated herein by reference in its entirety.

What is claimed is:

1. A light emitting device comprising:
   a point light source having a narrow distribution angle;
   a solid and transparent light guide having a circular, planar light receiving surface transverse to a light axis and receiving the light from the point light source, a reflecting side surface reflecting internally the light from the light receiving surface, and a light radiating surface radiating the light reflected on the reflecting side surface;
   a recess arranged at a center of the light receiving surface and facing the point light source; and a concave lens formed by a surface of the recess, wherein the reflecting side surface is a revolving surface determined by revolving a parabola around a center axis fitting to the light axis of the point light source, the parabola is a segment of a parabola passing through one point of peripheral border of the light receiving surface, and the other point of peripheral border of the light radiating surface; and having a focal point on the other point of peripheral border of the light receiving surface, obtained by assuming a plane containing the center axis and cutting off the light guide; two points of peripheral border of the light receiving surface; two point of peripheral border of the light radiating surface; and a coordinate system parallel to a straight line passing through one point of peripheral border of the light receiving surface and one point of peripheral border of the light radiating surface, and having a horizontal axis passing through the other point of peripheral border of the light receiving surface, the point light source is arranged apart from the light receiving surface and outside the light guide so as to divide the light from the point light source into light entering into the light guide through the surface of the recess and light entering into the light guide through some part of the light receiving surface other than the recess.

2. The light emitting device according to claim 1, further comprising many fine projections and depressions formed on the surface of the recess of the light receiving surface.

3. The light emitting device according to claim 1, wherein the point light source emits blue light; and a phosphor film including Yttrium Aluminum Garnet (YAG) phosphor that emits yellow or yellow-orange light by receiving the blue light is formed on the surface of the recess.

4. The light emitting device according to claim 1, further comprising a reflector having a concave reflecting surface, wherein the light guide is inserted through an opening of the reflector;

the light receiving surface faces the bottom of the reflector;

the point light source is arranged on the bottom of the reflector; and the concave reflecting surface reflects light swerved from the light receiving surface.

* * * * *